(12) United States Patent
Furuta et al.

(10) Patent No.: US 8,546,851 B2
(45) Date of Patent: Oct. 1, 2013

(54) SEMICONDUCTOR INTEGRATED CIRCUIT DEVICE

(75) Inventors: Hiroshi Furuta, Kanagawa (JP);
Takaaki Kobayashi, Kanagawa (JP);
Hirofumi Azuhata, Kanagawa (JP);
Tomoya Morita, Kanagawa (JP);
Ryuichi Okamura, Kanagawa (JP);
Toshifumi Takahashi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 149 days.

(21) Appl. No.: 13/150,842

(22) Filed: Jun. 1, 2011

(65) Prior Publication Data
US 2011/0316052 A1    Dec. 29, 2011

(30) Foreign Application Priority Data

Jun. 24, 2010 (JP) .................. 2010-143569

(51) Int. Cl.
| | |
|---|---|
| *H01L 27/10* | (2006.01) |
| *H01L 29/76* | (2006.01) |
| *H01L 29/94* | (2006.01) |
| *H01L 27/108* | (2006.01) |
| *H01L 31/119* | (2006.01) |

(52) U.S. Cl.
USPC ........... 257/204; 257/288; 257/401; 257/296; 257/334

(58) Field of Classification Search
USPC ................ 257/204, 68, 69, 70, 71, 296, 288, 257/401, 93, 334, 368, 491, 663, 713
See application file for complete search history.

(56) References Cited

U.S. PATENT DOCUMENTS

| | | | |
|---|---|---|---|
| 7,772,070 B2 | 8/2010 | Kitajima et al. | |
| 2007/0221957 A1 | 9/2007 | Kitajima et al. | |
| 2008/0128924 A1* | 6/2008 | Liu et al. | 257/797 |
| 2008/0283970 A1* | 11/2008 | Uchiyama et al. | 257/620 |
| 2009/0319971 A1 | 12/2009 | Sakakidani | |

FOREIGN PATENT DOCUMENTS

| | | |
|---|---|---|
| JP | 11-265891 | 9/1999 |
| JP | 2004-047643 | 2/2004 |
| JP | 2004-069993 | 3/2004 |
| JP | 2007-250705 | 9/2007 |
| JP | 2009-290060 | 12/2009 |
| JP | 2010-003949 | 1/2010 |

* cited by examiner

*Primary Examiner* — Chuong A. Luu
(74) *Attorney, Agent, or Firm* — Young & Thompson

(57) ABSTRACT

In addition to a memory macro region and functional circuit regions on a substrate, a semiconductor integrated circuit device includes a dummy pattern region 40 arranged between the functional circuit regions and between the memory macro region 10 and the functional circuit regions and including a dummy pattern. The dummy pattern has a pattern identical to that of diffusion layers and gate electrodes of a memory cell pattern in a memory cell array region. An area ratio of dummy diffusion layer(s) and dummy gate electrode(s) in the dummy pattern region is equal to or greater than that of the diffusion layers and the gate electrode(s) in the memory cell array region.

12 Claims, 6 Drawing Sheets

SEMICONDUCTOR INTEGRATED CIRCUIT DEVICE

TECHNICAL FIELD

1. Reference to Related Application

This application is based upon and claims the benefit of the priority of Japanese patent application No. 2010-143569, filed on Jun. 24, 2010, the disclosure of which is incorporated herein in its entirety by reference thereto.

The present invention relates to a semiconductor integrated circuit device having a memory macro region and a functional circuit region on a semiconductor substrate. In particular, it relates to a semiconductor integrated circuit device having a dummy pattern region outside a memory macro region and a functional circuit region on a semiconductor substrate.

2. Background

Some of the semiconductor integrated circuit devices having memory macro regions and functional circuit regions on a semiconductor substrate include a dummy pattern between functional circuit regions. Among such dummy patterns that include element isolation regions, diffusion layers, and gate electrodes, there are known: a dummy pattern formed as countermeasures against dishing caused during chemical mechanical polishing (CMP), which will be hereinafter referred to as a "CMP countermeasure dummy pattern"; and a dummy pattern formed to equalize the heat in a short-time optical annealing process such as flash lamp annealing (FLA) process, which will be hereinafter referred to as a "short-time optical annealing countermeasure dummy pattern."

As a technique relating to the CMP countermeasure dummy pattern, for example, Patent Document 1 discloses a semiconductor integrated circuit device including: functional circuit regions on a semiconductor substrate; and dummy metal-oxide semiconductor field-effect transistor (MOSFET) patterns each including a dummy diffusion layer and a dummy gate electrode formed outside the functional circuit regions. In a predetermined unit section, a plurality of dummy MOSFET patterns are arranged. In the predetermined unit section, each of the dummy MOSFET patterns is configured so that each of the dummy diffusion layer and the dummy gate electrode exhibits a constant data rate value. The dummy MOSFET pattern is not simply arranged as a dummy pattern including a diffusion layer and a gate electrode. In this document, a dummy pattern can be formed as a MOSFET with a set of the diffusion layer and the gate electrode in view of the area ratio of the diffusion layer and the area ratio of the gate electrode. Thus, this dummy pattern can be used as a spare MOSFET. When not used as a MOSFET, the dummy pattern can be used as a well potential diffusion layer or a substrate potential diffusion layer to prevent a latch-up phenomenon.

The dummy pattern can be used as a capacitive element. However, Patent Document 1 is silent on the short-time optical annealing countermeasure dummy pattern.

As a technique relating to the short-time optical annealing countermeasure dummy pattern, for example, Patent Document 2 discloses a semiconductor device manufacturing method. This method includes: a step (a) of forming an element isolation region on a semiconductor substrate so that the element isolation region surrounds and determines active regions, forming gate electrodes above the active regions and a wiring on the element isolation region, executing ion implantation of impurities, and preparing semiconductor device design data obtained by activating ion-implanted impurities through light illumination; and a step (b) of classifying one-dimensional structures in a thickness direction within a plane of the semiconductor substrate and calculating a two-dimensional distribution of effective optical absorption rates within a surface of the semiconductor substrate by using a weighted average of incident light reflectances and area densities of the individual one-dimensional structures and a weighted average of side surface areas of boundary surfaces of three-dimensional structures formed by regions having different optical characteristics and coefficients dependent on the three-dimensional structures. In this semiconductor device manufacturing method, the layout (dummy pattern) is determined based on optical absorption rates and characteristic variation data. In addition, in this semiconductor device manufacturing method, the polysilicon density of a dummy pattern arranged between a static random access memory (SRAM) region having a high area density and a circuit block is set to be high. Further, in this semiconductor device manufacturing method, to design the short-time optical annealing countermeasure dummy pattern, side surfaces such as the depth of shallow trench isolations (STIs) and the height of gate electrodes are taken into consideration. However, Patent Document 2 is silent on the CMP countermeasure dummy pattern.

As another technique relating to the short-time optical annealing countermeasure dummy pattern, Patent Document 3 discloses a method of examining the layout of a semiconductor integrated circuit device. In this method, the layout of a semiconductor integrated circuit device is divided into a plurality of local regions, and for each of local regions, the ratio of the area of a region where an element isolation layer is exposed on a surface of a semiconductor wafer of the semiconductor integrated circuit device to the area of the local region is calculated. The layout of the semiconductor integrated circuit device is examined based on this ratio. In this method of examining the layout of a semiconductor integrated circuit device, a short-time optical annealing countermeasure dummy pattern is arranged in view of the ratio of the element isolation region exposed in the local region. However, Patent Document 3 is silent on the CMP countermeasure dummy pattern.

Further, while not related to a technique of arranging a dummy pattern between functional circuit regions, in relation to a dummy pattern, a cell array, and improvement in processing accuracy, Patent Document 4 discloses arranging a memory dummy pattern to prevent loading effects. In addition, Patent Document 5 discloses using a dummy pattern arranged to improve processing accuracy as a capacitive element (bypass capacitor). In addition, Patent Document 6 discloses arranging dummy patterns to manage exposure during patterning. However, Patent Documents 4 to 6 are silent on neither the CMP countermeasure dummy pattern nor the short-time optical annealing countermeasure dummy pattern.

[Patent Document 1]
Japanese Patent Kokai Publication No. JP-P2007-250705A
[Patent Document 2]
Japanese Patent Kokai Publication No. JP-P2009-290060A
[Patent Document 3]
Japanese Patent Kokai Publication No. JP-P2010-3949A
[Patent Document 4]
Japanese Patent Kokai Publication No. JP-P2004-47643A
[Patent Document 5]
Japanese Patent Kokai Publication No. JP-P2004-69993A
[Patent Document 6]
Japanese Patent Kokai Publication No. JP-A-11-265891

SUMMARY

The entire disclosure of Patent Documents 1 to 6 are incorporated herein by reference thereto. The following analyses are given according to a view of the present invention.

However, no dummy pattern that simultaneously functions as both the CMP and short-time optical annealing countermeasure dummy patterns is known. None of the dummy patterns disclosed in the Patent Documents 1 to 3 simultaneously functions as both the CMP and short-time optical annealing countermeasure dummy patterns. Namely, none of the dummy patterns is optimized as satisfying both the countermeasures.

In addition, regarding the dummy patterns disclosed in Patent Documents 2 and 3, to form short-time optical annealing countermeasure dummy patterns, optimization needs to be executed in accordance with certain rules. For example, regarding the dummy pattern disclosed in Patent Document 2, to execute optimization, characteristic variations need to be examined in advance. Regarding the dummy pattern disclosed in Patent Document 3, it is unclear about how the local region is handled inside and outside the functional circuit block. Further, for example, neither of Patent Document 2 nor 3 discloses a specific pattern used as a dummy pattern. Therefore, regarding the dummy patterns disclosed in Patent Documents 2 and 3, since short-time optical annealing countermeasure dummy patterns cannot easily be determined, many design man-hours are required, which is counted as a problem.

Thus, no conventional devices include a dummy pattern that is optimized as satisfying both the CMP and short-time optical annealing countermeasure dummy patterns and that can be formed with a few design man-hours. Accordingly, there is much to be desired in the art.

According to a first aspect of the present invention, there is provided a semiconductor integrated circuit device comprising: a substrate; a memory macro region comprising a memory cell array region and a memory cell driving circuit region on the substrate; a plurality of functional circuit regions comprising functional circuit(s) on the substrate. A dummy pattern region is arranged between the plurality of functional circuit regions and between the memory macro region and the plurality of functional circuit regions and including a dummy pattern. The dummy pattern has a pattern identical to that of a diffusion layer(s) and a gate electrode(s) of a memory cell pattern in the memory cell array region. An area ratio of dummy diffusion layer(s) and dummy gate electrode(s) in the dummy pattern region is equal to or greater than that of the diffusion layer(s) and the gate electrode(s) in the memory cell array region.

According to a second aspect of the present invention, there is provided a semiconductor integrated circuit device comprising: a substrate; a basic circuit region comprising a basic circuit pattern on the substrate; a plurality of functional circuit regions comprising functional circuits on the substrate; and a dummy pattern region arranged between the plurality of functional circuit regions and between the basic circuit region and the plurality of functional circuit regions and including a dummy pattern. The dummy pattern has a pattern identical to that of a diffusion layer(s) and a gate electrode(s) of the basic circuit pattern in the basic circuit region. An area ratio of dummy diffusion layer(s) and dummy gate electrode(s) in the dummy pattern region is equal to or greater than that of the diffusion layer(s) and the gate electrode(s) in the basic circuit region.

The meritorious effects of the present invention are summarized as follows, however without limitation.
The present invention can provide a dummy pattern that functions as both the CMP and short-time optical annealing countermeasure dummy patterns, without requiring many man-hours.

Figure 1:
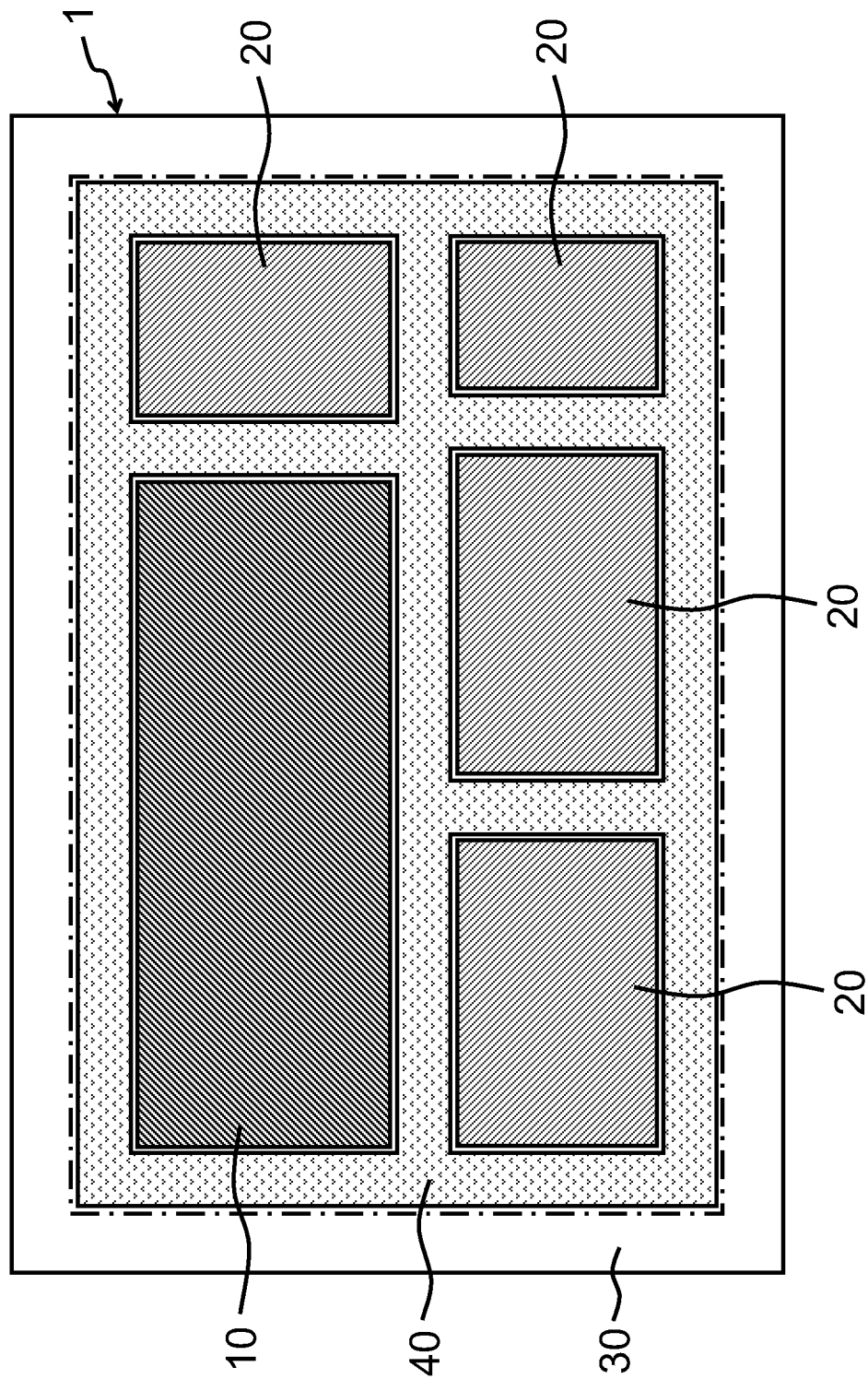
FIG. 1 is a plan view schematically illustrating a layout of a semiconductor integrated circuit device according to example 1 of the present invention.

The present disclosure includes at least the following preferred modes.
(Mode 1)
   as set forth in the first aspect.
(Mode 2)
   Based on the semiconductor integrated circuit device according to the present invention, it is preferable that the identical pattern have identical plane mask data or an identical shape when formed.
(Mode 3)
   Based on the semiconductor integrated circuit device according to the present invention, it is preferable that the dummy pattern be formed by arranging a plurality of patterns each being identical to the memory cell pattern of multiple bits.
(Mode 4)
   Based on the semiconductor integrated circuit device according to the present invention, it is preferable that the plurality of functional circuit regions also include the dummy pattern.
(Mode 5)
   Based on the semiconductor integrated circuit device according to the present invention, it is preferable that a repeating unit of the dummy pattern have a rectangular area S including a square with a side not less than 100 μm and not more than 200 μm; and it is preferable that the dummy diffusion layer(s) has an area Sad satisfying a relationship $0.2<Sad/S<0.7$, the dummy gate electrode(s) has an area Sag satisfying a relationship $0.2<Sag/S<0.7$, and the dummy diffusion layer(s) and the dummy gate electrode(s) have a total area Sad+Sag satisfying a relationship $0.5<(Sad+Sag)/S$.
(Mode 6)
   Based on the semiconductor integrated circuit device according to the present invention, it is preferable that the semiconductor integrated circuit device comprise a plurality of memory macro regions, wherein the dummy pattern has a pattern identical to that of diffusion layer(s) and gate electrode(s) of a memory cell pattern arranged in a larger one of the memory macro regions.
(Mode 7)
   Based on the semiconductor integrated circuit device according to the present invention, it is preferable that a predetermined one of the dummy diffusion layers and a predetermined one of the dummy gate electrodes in the dummy pattern operate as a MIS (Metal-Insulator-Semiconductor) capacitive element or a MISFET.
(Mode 8)
Based on the semiconductor integrated circuit device according to the present invention, it is preferable that a single well region include a plurality of the dummy gate electrodes connected to each other by an additional wiring, the dummy gate electrodes and the additional wiring being formed in the same layer and process.
(Mode 9)
Based on the semiconductor integrated circuit device according to the present invention, it is preferable that a predetermined one of the dummy diffusion layers and a predetermined one of the dummy gate electrodes in the dummy pattern be connected to a wiring having a predetermined potential.
(Mode 10)
As set forth in the second aspect.
(Mode 11)
Based on the semiconductor integrated circuit device according to the present invention, it is preferable that the basic circuit be a flip flop circuit or a gate array basic cell.
(Preferred Modes)
A semiconductor integrated circuit device (1 in FIG. 1) according to an exemplary embodiment of the present invention comprises: a substrate; a memory macro region (10 in FIG. 1) comprising a memory cell array region and a memory cell driving circuit region on the substrate; a plurality of functional circuit regions (20 in FIG. 1) comprising functional circuit(s) on the substrate; and a dummy pattern region (40 in FIG. 1) arranged between the plurality of functional circuit regions and between the memory macro region and the plurality of functional circuit regions and including a dummy pattern (41 in FIG. 3). The dummy pattern has a pattern identical to that of diffusion layers (12 and 13 in FIG. 3) and gate electrodes (14 in FIG. 3) of a memory cell pattern (11 in FIG. 3) in the memory cell array region. An area ratio of dummy diffusion layers and an area ratio of dummy gate electrodes in the dummy pattern region are equal to or greater than those of the diffusion layers and the gate electrodes in the memory cell array region, respectively.

Area ratios of the present invention are defined as follows: the diffusion layer area in a certain circuit region/the area of the certain circuit region; the gate electrode area in a certain circuit region/the area of the certain circuit region; and (the diffusion layer area in a certain circuit region+ the gate electrode area in the certain circuit region)/the area of the certain circuit region. For example, for area ratios of a functional circuit, assuming that the area of a functional circuit region and the diffusion layer area and the gate electrode area that are included in the functional circuit are S, Sd, and Sg, respectively, the diffusion layer area ratio, the gate electrode area ratio, and the area ratio of a combination of the diffusion layer area and the gate electrode area are represented as Sd/S, Sg/S, and (Sd+Sg)/S, respectively. Further, when a dummy pattern is formed by a plurality of memory cells, assuming that the area of the plurality of memory cells and the diffusion layer area and the gate electrode area that are included in the dummy pattern (the plurality of memory cells) are Sc, Sdc, and Sgc, respectively, the diffusion layer area ratio, the gate electrode area ratio, and the area ratio of a combination of the diffusion layer area and the gate electrode area are represented as Sdc/Sc, Sgc/Sc, and (Sdc+Sgc)/Sc, respectively.

The description in the present application includes reference characters of the drawings. However, such reference characters only serve to facilitate understanding of the present invention. It is to be understood that the present invention is not limited to the modes illustrated in the drawings.

EXAMPLE 1

Figure 2:
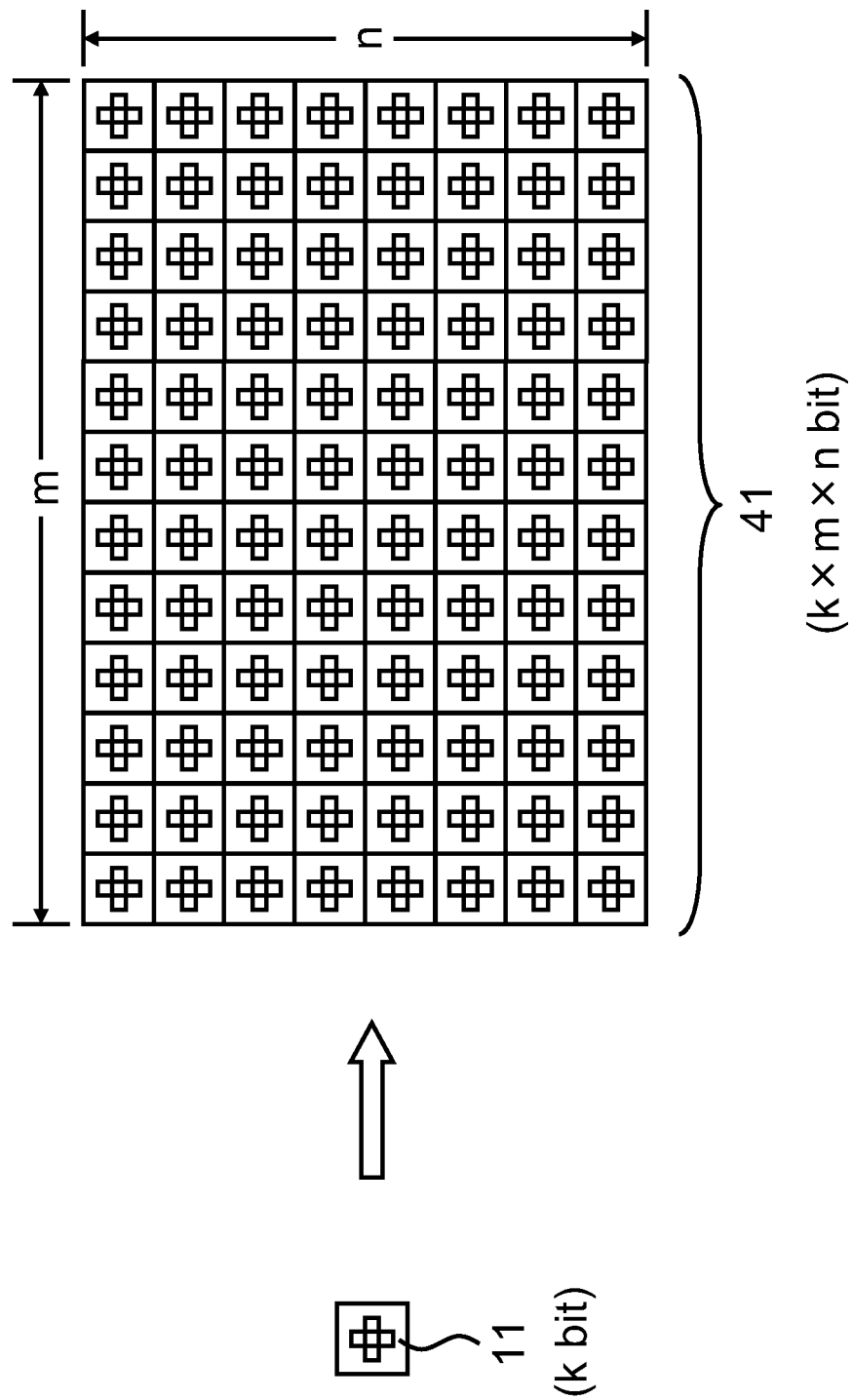
FIG. 2 is a diagram schematically illustrating a relationship between a memory cell pattern and a dummy pattern of the semiconductor integrated circuit device according to example 1 of the present invention.
Figure 3:
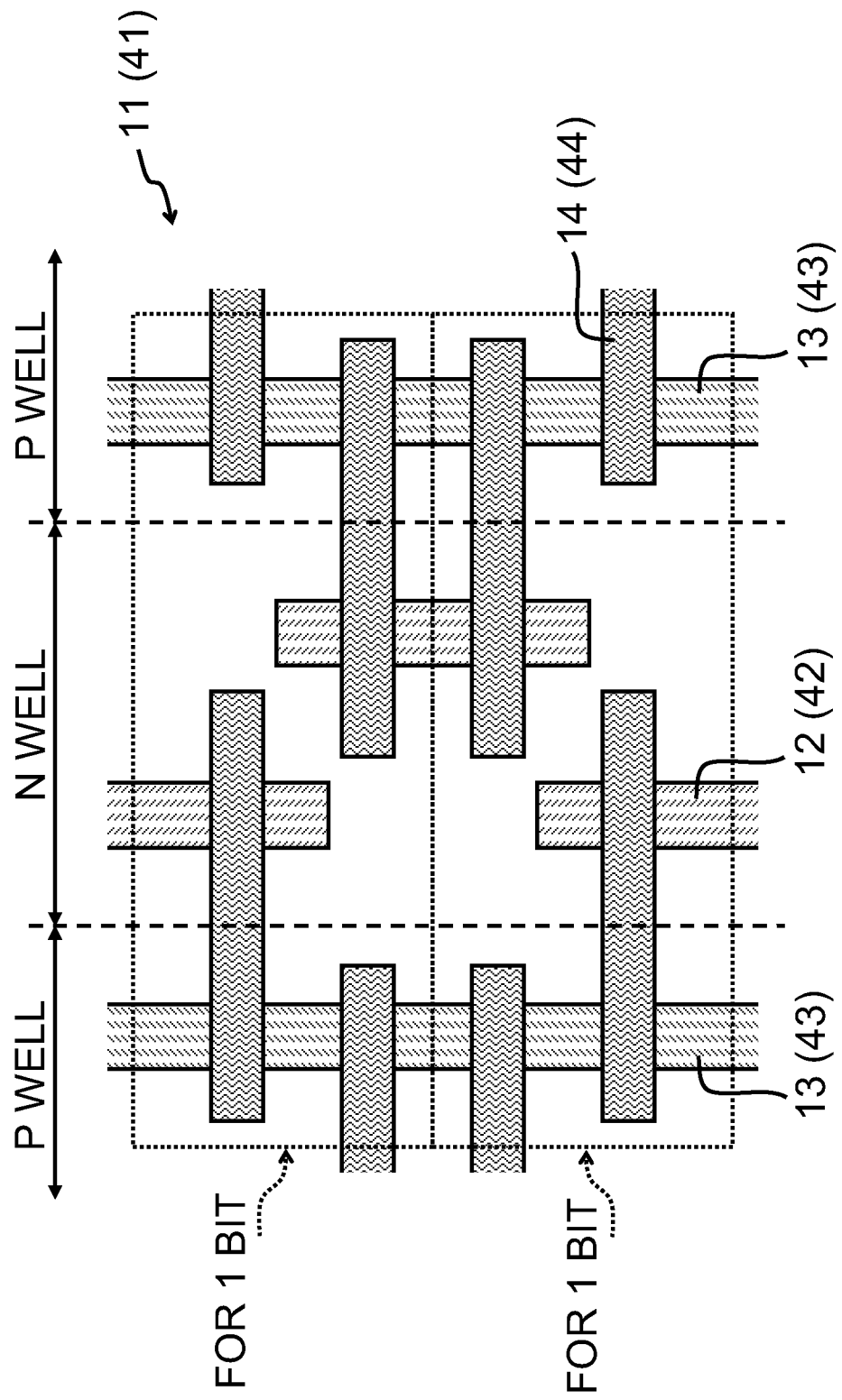
FIG. 3 is a plan view schematically illustrating an example of a configuration of a 2-bit memory cell pattern (dummy pattern) of the semiconductor integrated circuit device according to example 1 of the present invention.

A semiconductor integrated circuit device according to example 1 of the present invention will be described with reference to the drawings. FIG. 1 is a plan view schematically illustrating a layout of the semiconductor integrated circuit device according to example 1 of the present invention. FIG. 2 is a diagram schematically illustrating a relationship between a memory cell pattern and a dummy pattern of the semiconductor integrated circuit device according to example 1 of the present invention. FIG. 3 is a plan view schematically illustrating an example of a configuration of a 2-bit memory cell pattern (or dummy pattern) of the semiconductor integrated circuit device according to example 1 of the present invention.

In FIG. 1, the semiconductor integrated circuit device according to example 1 includes, on a surface where circuits of a semiconductor chip 1 are formed, a memory macro region 10, functional circuit regions 20, an input/output (I/O) circuit region 30, and a dummy pattern region 40.

The memory macro region 10 includes a memory cell array region and a memory cell driving circuit region. The memory cell array region is arranged in a middle section of the memory macro region 10 and includes a memory cell array in which repetition of a memory cell pattern (for example, 11 in FIGS. 2 and 3) is arranged in rows and columns. The memory cell array includes metal insulator semiconductor field effect transistors (MISFETs). For example, the memory cell array includes memory elements such as static random access memories (SRAMs), dynamic random access memories (DRAMs), or magnetic random access memories (MRAMs). The memory cell driving circuit region is arranged on the periphery of the memory macro region 10 and includes memory cell driving circuits such as decoder circuits and sense amplifier circuits for driving the memory cell array. Normally, the memory cell driving circuit region is arranged around the memory cell array region. The dummy pattern region 40 is arranged around the memory macro region 10.

Each of the memory cell patterns (11 in FIGS. 2 and 3) is a pattern including diffusion layers (12 and 13 in FIG. 3) and gate electrodes (14 in FIG. 3) formed in a unit memory cell region of the memory macro region (10 in FIG. 1). Each of the diffusion layers 12 is a P-type diffusion layer formed on an N-well of the semiconductor substrate and functions as a source/drain region of a MISFET. Each of the diffusion layers 13 is an N-type diffusion layer formed on a P-well of the semiconductor substrate and functions as a source/drain region of the MISFET. Each of the gate electrodes 14 is formed at least above a channel between diffusion layers 12 (or 13) functioning as source and drain regions via a gate insulating film (not illustrated). FIG. 3 illustrates a unit memory cell pattern 11 formed by 2-bit SRAM cells when the memory cell pattern is configured as an SRAM.

In each of the functional circuit regions 20, predetermined functional circuits such as for calculation and communication are arranged. A plurality of functional circuit regions 20 are arranged on the semiconductor chip 1 (see FIG. 1). In each of the functional circuit regions 20, diffusion layers (not illustrated)) and gate electrodes (not illustrated), which are components of functional circuit elements, are arranged. The total area ratio of the diffusion layers and the gate electrodes in each of the functional circuit regions 20 is smaller than that of the diffusion layers (12 and 13 in FIG. 3) and the gate electrodes (14 in FIG. 3) of the memory cell pattern (11 in FIG. 3) in the memory macro region 10. The dummy pattern region 40 is arranged around each of the functional circuit regions 20.

The I/O circuit region 30 is arranged on the periphery of the semiconductor chip 1 and includes I/O circuits such as pads and buffers necessary for inputting and outputting signals and power supplies. The dummy pattern region 40 is arranged also along the inner periphery of the I/O circuit region 30 on the inner side thereof.

The dummy pattern region (40 in FIG. 1) is arranged at least between a plurality of functional circuit regions (20 in FIG. 1) and between the memory macro region (10 in FIG. 1) and a functional circuit region (20 in FIG. 1) and includes a dummy pattern (41 in FIGS. 2 and 3). The dummy pattern region 40 is arranged around the memory macro region 10 and each of the functional circuit regions 20. In addition, the dummy pattern region 40 is arranged along the inner periphery of the I/O circuit region 30.

The dummy pattern (41 in FIGS. 2 and 3) has a pattern identical to that of the diffusion layers (12 and 13 in FIG. 3) and the gate electrodes (14 in FIG. 3) of the memory cell pattern (11 in FIGS. 2 and 3) in the memory cell array region in the memory macro region (10 in FIG. 1). The identical pattern has identical plane mask data or an identical shape when formed. In other words, each of the dummy patterns (41 in FIGS. 2 and 3) includes dummy diffusion layers (42 and 43 in FIG. 3) and dummy gate electrodes (44 in FIG. 3) having a pattern or shape identical to that of the diffusion layers (12 and 13 in FIG. 3) and the gate electrodes (14 in FIG. 3), respectively, of each of the memory cell patterns (11 in FIGS. 2 and 3). Each of the dummy diffusion layers 42 is a P-type diffusion layer formed on an N-well of the semiconductor substrate. Each of the dummy diffusion layers 43 is an N-type diffusion layer formed on a P-well of the semiconductor substrate. Each of the dummy gate electrodes 44 is formed at least above a channel between dummy diffusion layers 42 (or 43) functioning as source and drain regions via a gate insulating film (not illustrated).

Each of the dummy patterns (41 in FIG. 2) is formed by arranging a plurality of patterns each being identical to the memory cell pattern (11 in FIG. 2) of multiple bits (k bits in FIG. 2). For example, when memory elements such as DRAMs or SRAMs are included in the memory macro region (10 in FIG. 1), a plurality of memory cell patterns (each being k bits in the case of the pattern 11 in FIG. 2) are combined to achieve multiple bits (k×m×n bits in FIG. 2). The obtained pattern is used as a basic dummy pattern (41 in FIG. 2), and a plurality of these basic dummy patterns are repeatedly arranged.

The dummy pattern (41 in FIGS. 2 and 3) may be partly arranged in any one of the functional circuit regions (20 in FIG. 1), too.

The total area ratio of the dummy diffusion layers (42 and 43 in FIG. 3) and the dummy gate electrodes (44 in FIG. 3) of the dummy pattern (41 in FIG. 3) in the dummy pattern region (40 in FIG. 1) is set to be equal to or greater than (equal in FIG. 3) that of the diffusion layers (12 and 13 in FIG. 3) and the gate electrodes (14 in FIG. 3) of the memory cell pattern (11 in FIG. 3) in the memory cell array region in the memory macro region (10 in FIG. 1). Namely, the memory cell pattern (11 in FIG. 2), which is a circuit pattern having a high area ratio on the semiconductor chip (1 in FIG. 1), is used as the dummy pattern (41 in FIG. 2). As the area ratio, the plane (top surface) pattern of the dummy diffusion layers 42 and 43 and the dummy gate electrodes 44 may be used. Of course, the area of the side surfaces (sidewall surfaces) of the dummy gate electrodes 44 may be considered, too as in Patent Document 2. If the area of the side surfaces of the dummy gate electrodes 44 is considered, since the depth of element isolation regions (STIs, for example) and the height of the dummy gate electrodes 44 are fixed in value, it is only necessary to multiply the plane area of the dummy gate electrodes 44 by certain constant(s). Thus, unless a special pattern is used, even if the plane area is used to calculate the area ratio, no problem is caused.

A repeating unit (corresponding to a region of 2 bits in FIG. 3) of the dummy pattern (41 in FIG. 3) has a rectangular area S (including a square) with a side not less than 100 µm and not more than 200 µm. The dummy diffusion layers 42 and 43 have an area Sad set to satisfy a relationship $0.2<Sad/S<0.7$, the dummy gate electrodes 44 have an area Sag set to satisfy a relationship $0.2<Sag/S<0.7$, and the dummy diffusion layers 42 and 43 and the dummy gate electrodes 44 have a total area (Sad+Sag) set to satisfy a relationship $0.5<(Sad+Sag)/S$, by way of example.

Within the regions (10, 20, 30, and 40 in FIG. 1) on the semiconductor chip (1 in FIG. 1), in the regions other than those where element diffusion layers and channel regions are arranged, element isolation regions such as LOCOS (local oxidation of silicon) regions or STI (Shallow Trench Isolation) regions are formed.

Figure 4:
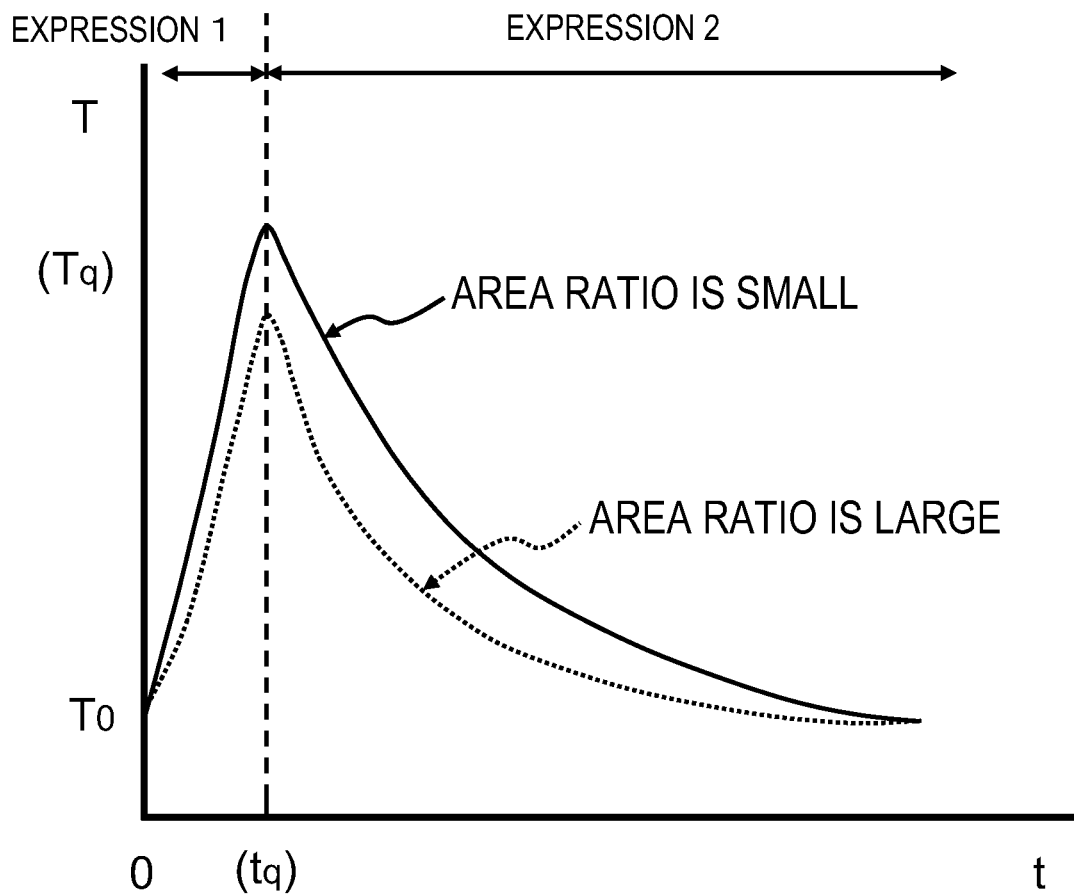
FIG. 4 is a graph schematically illustrating a relationship between the temperature and the time when the semiconductor integrated circuit device according to example 1 of the present invention is heated and cooled.

Next, an operation (action) of the semiconductor integrated circuit device according to example 1 of the present invention will be described with reference to the drawings. FIG. 4 is a graph schematically illustrating a relationship between the temperature and the time when the semiconductor integrated circuit device according to example 1 of the present invention is heated and cooled.

First, conditions required to form a dummy pattern optimized as satisfying both the CMP and short-time optical annealing countermeasure dummy patterns will be reviewed.

For a CMP countermeasure dummy pattern, each of the area ratio of the diffusion layers and the area ratio of the gate electrodes needs to have a predetermined value, as in the case of the dummy pattern disclosed in Patent Document 1 (referred to as "data rate"; data rates of approximately, 25% to 75% are disclosed).

On the other hand, for a short-time optical annealing countermeasure dummy pattern, to equalize the heat, it is necessary to set a constant area ratio (the definition may be changed to call "CMP countermeasure dummy pattern").

The region for which thermal propagation is considered differs depending on whether the annealing time is approximately several milliseconds raying to several seconds. If RTA (rapid thermal annealing: high-temperature annealing apparatus) is carried out for approximately several seconds, a region on the order of 1 mm☐ (square) needs to be considered. If annealing is carried out for approximately several milliseconds, a region on the order of 100 µm☐ (square) needs to be considered. Particularly, if annealing is carried out for approximately several milliseconds, a difference in the local area ratio causes a temperature difference.

In example 1, the dummy pattern (41 in FIGS. 2 and 3) includes the dummy diffusion layers (42 and 43 in FIG. 3) and the dummy gate electrodes (44 in FIG. 3) having a pattern or shape identical to that of the diffusion layers (12 and 13 in FIG. 3) and the gate electrodes (14 in FIG. 3) of the memory cell pattern (11 in FIGS. 2 and 3), respectively, in the memory cell array region in the memory macro region (10 in FIG. 1). In addition, the dummy diffusion layers (42 and 43 in FIG. 3) and the dummy gate electrodes (44 in FIG. 3) have an area ratio identical to that of the diffusion layers (12 and 13 in FIG. 3) and the gate electrodes (14 in FIG. 3), respectively. Consequently, the thermal uniformity in the semiconductor chip (1 in FIG. 1) is improved. Reasons for such meritorious effect will be described below.

Assuming that the semiconductor chip (1 in FIG. 1) is illuminated with a light beam having a certain constant energy for a certain given time and the heat quantity per unit time is Q, then, as the chip temperature increases, the heat radiation from the chip occurs at the same time. Heat absorption is associated with heat radiation. If the light illumination is stopped, the temperature stops increasing and starts decreasing over time. Herein, this phenomenon is simplified and represented as Expressions 1 and 2.

$$T = (\alpha/C) Q \times t + T_0 \quad \text{(Expression 1)}$$

T: temperature
α: heat absorption rate (relating to heat generation)
C: constant of the product of the specific heat and the chip mass
Q: heat quantity
t: time (0 to $t_q$)
$t_q$: light illumination time
$T_0$: chip temperature when t=0 (initial chip temperature)
$T_q$: chip temperature when t=$t_q$ $$\delta T/\delta t = T_q - (\beta/C)(T - T_0) \quad \text{(Expression 2)}$$

T: temperature
t: time (t≥$t_q$)
$T_q$: chip temperature when t=$t_q$
β: thermal conductivity (heat radiation from material)
C: constant of the product of the specific heat and the chip mass
$T_0$: chip temperature when t=0 (initial chip temperature)

In the above Expressions 1 and 2, T represents the temperature, t the time, $T_0$ an initial chip temperature, and C a constant of the product of the specific heat and the substrate mass. It is assumed that depending on the chip structure (area ratio), the absorption rate (relating to heat generation) α and thermal conductivity (heat radiation from material) β of a given region are determined.

Expression 1 shows that, during the light illumination time from the time 0 to $t_q$, the temperature increases in proportion to the time (while the heat is simultaneously radiated, the heat radiation is ignored herein). The temperature increases from $T_0$ to $T_q$ during the light illumination. Expression 1 is valid from the time 0 to $t_q$.

Expression 2 represents cooling (heat radiation) after the light illumination. If t=$t_q$ and T=$T_q$ ($T_q$>$T_0$), Expression 2 can be represented as Expression 3.

$$T = \{T_q(1 - C/\beta) - T_0\} \exp(\beta/C) \exp(-\beta \times t/C) + C \times T_q/\beta + T_0 \quad \text{(Expression 3)}$$

T: temperature
C: constant of the product of the specific heat and the chip mass
β: thermal conductivity (heat radiation from material)
$T_0$: chip temperature when t=0 (initial chip temperature)
t: time
$T_q$: chip temperature when t=$t_q$ If the area ratio is larger (if an element isolation region such as an STI is smaller), the absorption rate α has a smaller value and the thermal conductivity β has a larger value. If the absorption rate α has a smaller value, the temperature increases more gradually and the highest (peak) temperature $T_q$ is lowered. If the thermal conductivity β has a larger value, the temperature decreases more quickly and is therefore lowered in a shorter time.

FIG. 4 schematically illustrates results of Expressions 1 and 2. By arranging a dummy pattern having a high area ratio, a local temperature increase can be suppressed and the time during which the semiconductor chip is in a high-temperature state can be reduced. Thus, as a result, the effective annealing temperature can be uniformed (or equalized).

According to example 1, the dummy pattern (41 in FIGS. 2 and 3) having an area ratio identical to that of the memory cell pattern (11 in FIGS. 2 and 3), which is arranged in the memory cell array region in the memory macro region (10 in FIG. 1) having a high area ratio among the regions on the chip, is arranged in the dummy pattern region (40 in FIG. 1). Thus, the dummy pattern (41 in FIGS. 2 and 3) optimized as the CMP and short-time optical annealing countermeasure dummy patterns can be provided. In addition, designing the dummy pattern (41 in FIGS. 2 and 3) does not require much time. Particularly, by arranging a plurality of memory cell patterns (11 in FIG. 2) in rows and columns (n×m) and using the pattern as a basic dummy pattern (41 in FIG. 2), little time is required to design the dummy pattern. Since many system-on-chip (SoC) devices include a memory macro (particularly, a memory cell array), example 1 can easily be applied.

Next, whether or not the dummy pattern can be determined such easily will be examined. As described above, FIG. 3 illustrates a layout of SRAM cells. First, the area ratio of the diffusion layers 12 and 13 (dummy diffusion layers 42 and 43) and the area ratio of the gate electrodes 14 (dummy gate electrodes 44) are calculated. As the CMP countermeasure dummy pattern, the diffusion layers 12 and 13 (dummy diffusion layers 42 and 43) have an area ratio of approximately 35% (including the channel regions), and the gate electrodes 14 (dummy gate electrodes 44) have an area ratio of approximately 30%. As the short-time optical annealing countermeasure dummy pattern, the area ratio is approximately 65%. If the regions where the diffusion layers and the gate electrodes overlap are not added (channel regions during operation as a MOSFET), the area ratio is approximately 55%. If the pattern is configured as a DRAM cell, the area ratio will be larger than that of an SRAM cell. Particularly, when annealing of approximately several milliseconds, such as Flash Lamp Anneal FLA that is greatly dependent on the pattern, is executed, a dummy pattern having a size approximately from 100 μm to 200 μm□ (square) is prepared. Of course, a plurality of these patterns may be arranged in accommodation with an interval between functional blocks. Alternatively, a smaller dummy pattern may be used as a basic pattern, and a required number of these patterns may be arranged.

Example 1 is particularly effective when the dummy pattern region (40 in FIG. 1) is arranged between functional circuit regions (20 in FIG. 1) near the memory macro region (10 in FIG. 1) having a high area ratio pattern.

In example 1, the chip includes a single memory macro region. If the chip includes a plurality of memory macro regions, a pattern of diffusion layers and gate electrodes of a memory cell pattern in a larger one of the memory macro regions is used as the dummy pattern. In addition, if a single chip includes a plurality of memory macro regions including different memory cell arrays, for example, if a single chip includes a memory macro including a DRAM cell array and a memory macro including an SRAM cell array, a pattern of diffusion layers and gate electrodes of a memory cell pattern in a larger one, in area, of the memory macro regions is used as the dummy pattern.

EXAMPLE 2

Figure 5:
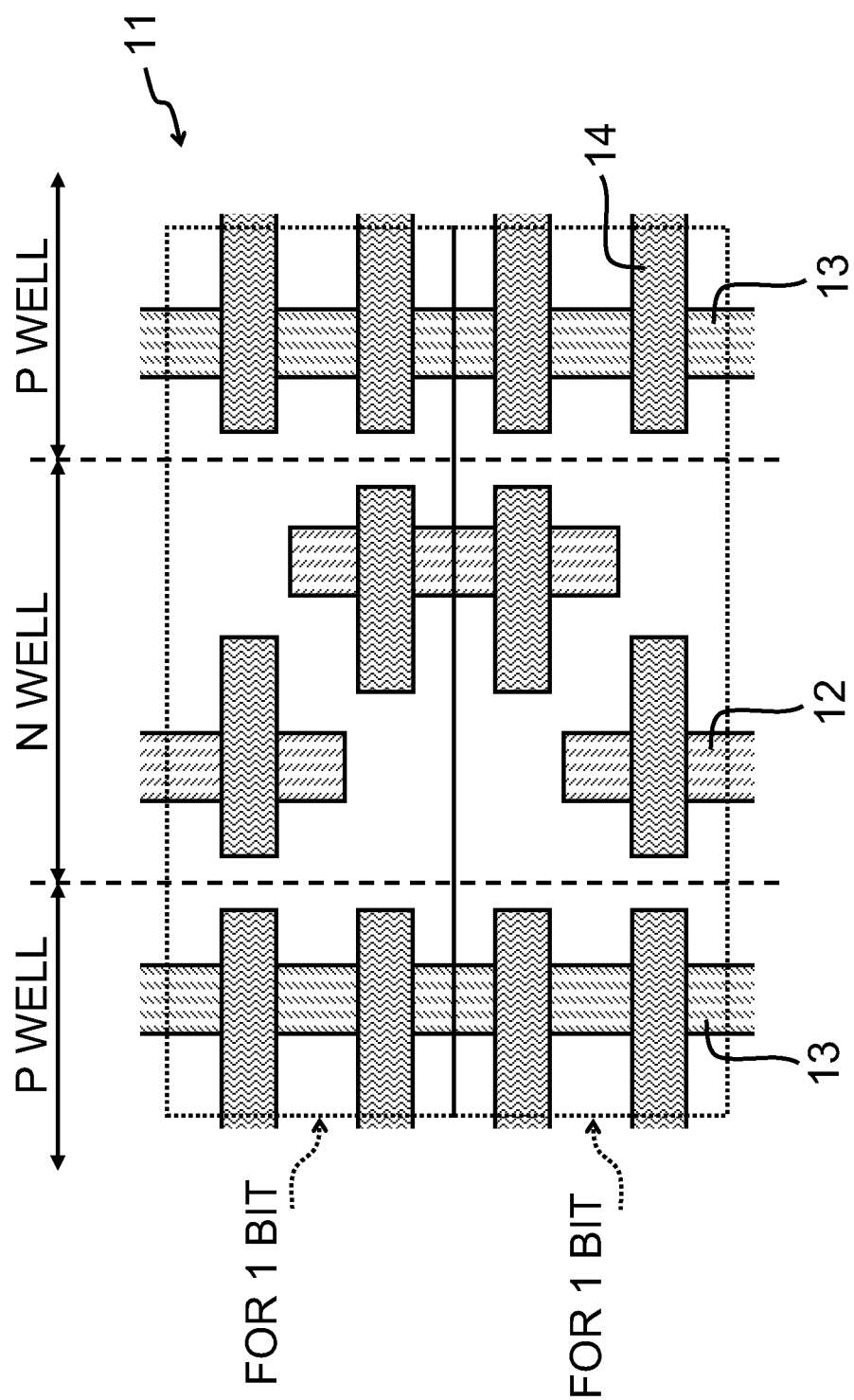
FIG. 5 is a plan view schematically illustrating an example of a configuration of a 2-bit memory cell pattern of a semiconductor integrated circuit device according to example 2 of the present invention.
Figure 6:
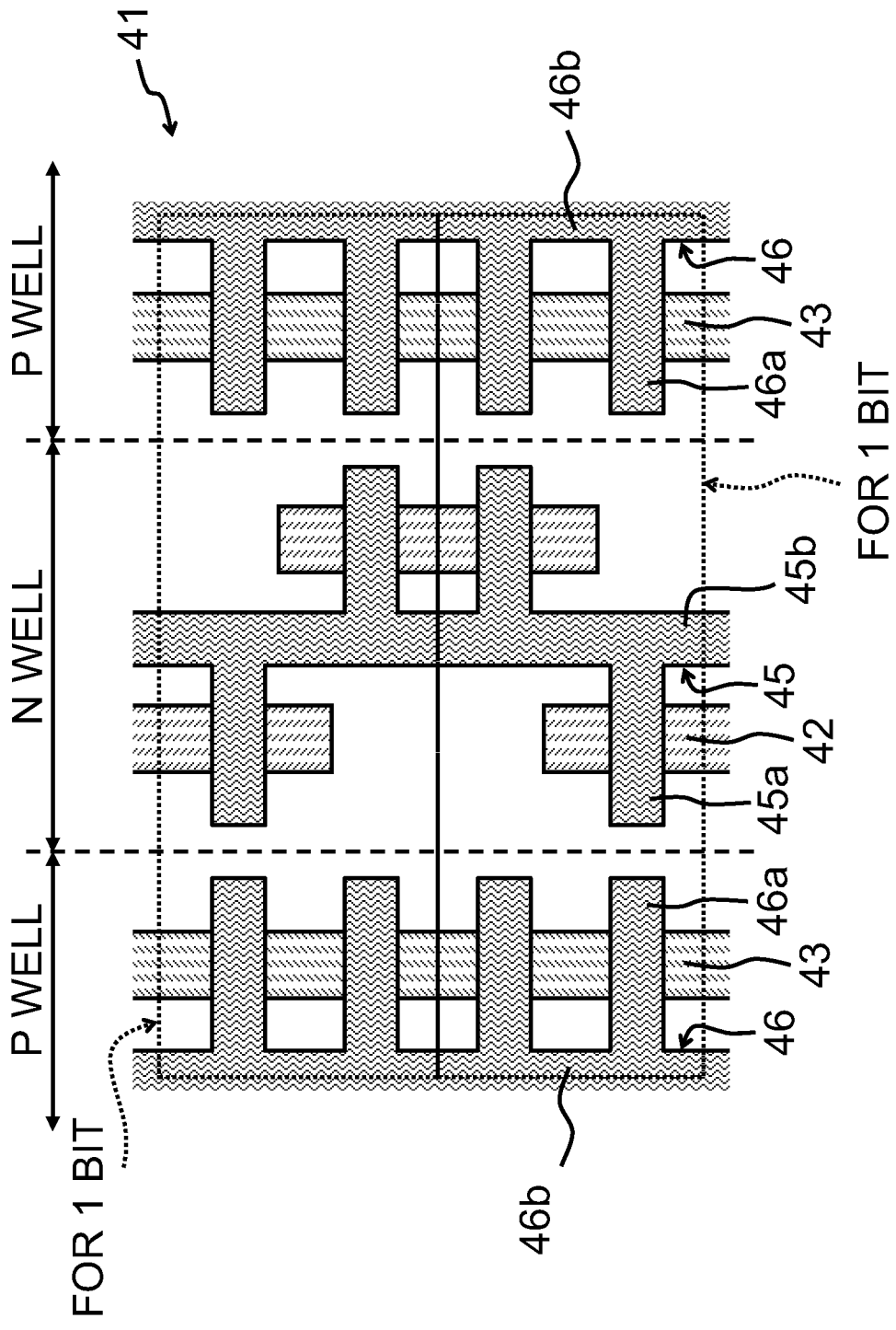
FIG. 6 is a plan view schematically illustrating an example of a configuration of a 2-bit dummy pattern of the semiconductor integrated circuit device according to example 2 of the present invention.

A semiconductor integrated circuit device according to example 2 of the present invention will be described with reference to the drawings. FIG. 5 is a plan view schematically illustrating an example of a configuration of a 2-bit memory cell pattern of the semiconductor integrated circuit device according to example 2 of the present invention. FIG. 6 is a plan view schematically illustrating an example of a configuration of a 2-bit dummy pattern of the semiconductor integrated circuit device according to example 2 of the present invention.

In many large scale integration (LSI) circuits, in addition to dummy patterns, decoupling capacitors are also arranged among a plurality of functional circuit regions (corresponding to 20 in FIG. 1). In example 2, the dummy pattern (41 in FIG. 6) is used as an electrically operating element, likewise in Patent Document 1. Namely, in example 2, to arrange decoupling capacitors (capacitive elements) in part of the dummy pattern region (corresponding to 40 in FIG. 1) of example 1, there are arranged: a capacitive dummy gate electrode 45 (46) formed by connecting individual dummy gate electrode portions 45*a* (46*a*) in the same well region to an additional wiring portion 45*b* (46*b*); and dummy diffusions layers 42 and 43 (see FIG. 6). The dummy gate electrode portions (45*a* and 46*a* in FIG. 6), not the additional wiring portions (45*b* and 46*b* in FIG. 6), of the capacitive dummy gate electrodes (45 and 46 in FIG. 6) have a pattern or shape identical to that of the gate electrodes (14 in FIG. 5) of the memory cell pattern (11 in FIG. 5) in the memory cell array region in the memory macro region (corresponding to 10 in FIG. 1). The additional wiring portions (45*b* and 46*b* in FIG. 6) are arranged in the same layer as that of the dummy gate electrode portions (45*a* and 46*a* in FIG. 6). The dummy diffusion layers (42 and 43 in FIG. 6) have a pattern or shape identical to that of the diffusion layers (12 and 13 in FIG. 5) of the memory cell pattern (11 in FIG. 5) in the memory cell array region in the memory macro region (corresponding to 10 in FIG. 1). Other configurations are identical to those according to example 1.

The dummy pattern 41 is arranged in the dummy pattern region (corresponding to 40 in FIG. 1). The dummy pattern 41 has a pattern identical to that of the diffusion layers (12 and 13 in FIG. 5) and the gate electrodes (14 in FIG. 5) of the memory cell pattern (11 in FIG. 5) in the memory cell array region in the memory macro region (corresponding to 10 in FIG. 1). The identical pattern has identical plane mask data or an identical shape when formed. In other words, the dummy pattern 41 includes dummy diffusion layers 42 and 43 and dummy gate electrode portions 45*a* and 46*a* having a pattern or shape identical to that of the diffusion layers (12 and 13 in FIG. 5) and the gate electrodes (14 in FIG. 5) of the memory cell pattern (11 in FIG. 5). Each of the dummy diffusion layers 42 is a P-type diffusion layer formed on an N-well of the semiconductor substrate. Each of the dummy diffusion layers 43 is an N-type diffusion layer formed on a P-well of the semiconductor substrate. Each of the dummy gate electrode portions 45*a* (or 46*a*) is formed at least on a channel between dummy diffusion layers 42 (or 43) functioning as source and drain regions via a gate insulating film (not illustrated). The dummy gate electrode portions 45*a* (or 46*a*) in a well region of the same conductivity type are connected to each other by the additional wiring portion 45*b* (46*b*). The dummy gate electrode portions 45*a* (or 46*a*) and the additional wiring portion 45*b* (or 46*b*) form the capacitive dummy gate electrode 45 (or 46). The capacitive dummy gate electrodes 45 (46) and the dummy diffusion layers 42 (43) are used as MIS (Metal-Insulator-Semiconductor) capacitive elements. The capacitive dummy gate electrode 45 and the dummy diffusion layer 42 form a PMISFET, and the capacitive dummy gate electrode 46 and the dummy diffusion layer 43 form an NMISFET. As a specific utilization, for example, the dummy pattern 41 can be used as a decoupling capacity between a power supply and a GND. In this case, the dummy diffusion layers 43 and the capacitive dummy gate electrodes 45 may be connected to a GND wiring, and the dummy diffusion layers 42 and the capacitive dummy gate electrodes 46 may be connected to a power supply wiring.

As in example 1 (FIG. 2), each of the dummy patterns (41 in FIG. 6) is formed by arranging a plurality of patterns each being identical to the memory cell pattern (11 in FIG. 2) of multiple bits (k bits in FIG. 2). In addition, regarding the total area ratio of the dummy diffusion layers (42 and 43 in FIG. 6) and the capacitive dummy gate electrodes (45 and 46 in FIG. 6) of the dummy pattern (41 in FIG. 6) in the dummy pattern region (corresponding to 40 in FIG. 1) and the total area ratio of the diffusion layers (12 and 13 in FIG. 5) and the gate electrodes (14 in FIG. 5) of the memory cell pattern (11 in FIG. 5) in the memory cell array region in the memory macro region (corresponding to 10 in FIG. 1), the total area ratio in the dummy pattern 41 is greater than that in the memory cell pattern (11 in FIG. 5) since the dummy pattern 41 includes the additional wiring portions 45*b* (46*b*) in FIG. 6.

FIG. 6 illustrates an example of the dummy pattern 41 formed by using the memory cell pattern (11 in FIG. 5) of an SRAM circuit. Since the memory cell pattern (11 in FIG. 5) of the SRAM circuit has a high area ratio, by connecting only the dummy gate electrode portions 45*a* (46*a*) to the additional wiring portion 45*b* (46*b*) as illustrated in FIG. 6, the pattern can be used as a capacitive element. Thus, as a capacitive element, there is no need to calculate the area ratio and design the pattern. In addition, both the NMISFET and the PMISFET are used as capacitive elements in FIG. 6, only either one or part of which may be used.

According to example 2, meritorious effects similar to those according to example 1 can be provided. In addition, without requiring many design man-hours, a dummy pattern as the CMP and short-time optical annealing countermeasure dummy patterns and a capacitive element can be realized. Namely, if a dummy pattern and a capacitive element are independently designed from one another, many design man-hours are required. However, example 2 requires few design man-hours. Further, as to the capacitance value of a capacitive element, by calculating the capacitance value of a single dummy pattern (repetitive basic pattern) and multiplying the calculated value by a required number of dummy patterns, the total capacitance value can be calculated.

EXAMPLE 3

Next, a semiconductor integrated circuit device according to example 3 of the present invention will be described.

Examples 1 and 2 have been described, assuming that a memory cell array is present. In example 3, cases where no memory cell array is present (the memory macro region 10 in FIG. 1 is not present) will be described. In example 3, in the functional circuit regions (20 in FIG. 1) on a semiconductor chip (corresponding to 1 in FIG. 1), a functional circuit region including a plurality of functional circuit patterns (basic circuit patterns) each having a high-area-ratio pattern (diffusion layers and gate electrodes) used at least in a region from 100 μm to several hundred μm□ (square) is used as a basic circuit region. A dummy pattern (dummy diffusion layers and dummy gate electrodes) having a pattern or shape identical to that of the basic circuit pattern (diffusion layers and gate electrodes) in the basic circuit region is arranged in a dummy pattern region (corresponding to 40 in FIG. 1). Examples of such basic circuit pattern include a flip flop circuit (FF circuit) and a gate array basic cell. The area ratio of the dummy pattern (dummy diffusion layers and dummy gate electrodes) in the dummy pattern region is set to be equal to or greater than the area ratio of the basic circuit pattern (diffusion layers and gate electrodes) in the basic circuit region.

In addition, based on a concept similar to example 3, if a single functional circuit region includes circuit patterns having a large area ratio difference, a dummy pattern (dummy diffusion layers and dummy gate electrodes) having a pattern or shape identical to that of a circuit pattern (diffusion layers and gate electrodes) having a larger area ratio may be arranged in the dummy pattern region (corresponding to 40 in FIG. 1). Further, if such functional circuit region includes a space (the pattern near the space has a small area ratio), a dummy pattern (dummy diffusion layers and dummy gate electrodes) having a pattern or shape identical to that of a circuit pattern (diffusion layers and gate electrodes) having a larger area ratio may be arranged in the space.

Other configurations are identical to those according to example 1.

According to example 3, meritorious effects similar to those of example 1 can be provided.

Modifications and adjustments of the exemplary embodiments and examples are possible within the scope of the overall disclosure (including claims) of the present invention and based on the basic technical concept of the invention. Various combinations and selections of various disclosed elements are possible within the scope of the claims of the present invention. That is, the present invention of course includes various variations and modifications that could be made by those skilled in the art according to the overall disclosure including the claims and the technical concept.

It should be noted that other aspects and objects and modes of the invention will become apparent from the entire disclosure including claims and drawings of the present disclosure.

What is claimed is:

1. A semiconductor integrated circuit device comprising:
    a substrate;
    a memory macro region comprising a memory cell array region and a memory cell driving circuit region on the substrate;
    a plurality of functional circuit regions comprising functional circuit(s) on the substrate; and
    a dummy pattern region arranged between the plurality of functional circuit regions, said dummy pattern region being arranged between the memory macro region and the plurality of functional circuit regions, said dummy pattern region including a dummy pattern;
    wherein the dummy pattern has a pattern identical to that of a diffusion layer(s) and a gate electrode(s) of a memory cell pattern in the memory cell array region; and
    wherein an area ratio of dummy diffusion layer(s) and dummy gate electrode(s) in the dummy pattern region is equal to or greater than that of the diffusion layer(s) and the gate electrode(s) in the memory cell array region.

2. The semiconductor integrated circuit device according to claim 1, wherein the identical pattern has identical plane mask data or an identical shape when formed.

3. The semiconductor integrated circuit device according to claim 1, wherein the dummy pattern is formed by arranging a plurality of patterns each being identical to the memory cell pattern of multiple bits.

4. The semiconductor integrated circuit device according to claim 1, wherein the plurality of functional circuit regions also include the dummy pattern.

5. The semiconductor integrated circuit device according to claim 1,
    wherein a repeating unit of the dummy pattern has a rectangular area S including a square with a side not less than 100 m and not more than 200 m; and
    wherein the dummy diffusion layer(s) has an area Sad satisfying a relationship $0.2 < Sad/S < 0.7$, the dummy gate electrode(s) has an area Sag satisfying a relationship $0.2 < Sag/S < 0.7$, and the dummy diffusion layer(s) and the dummy gate electrode(s) have a total area Sad+Sag satisfying a relationship $0.5 < (Sad+Sag)/S$.

6. The semiconductor integrated circuit device according to claim 1, further comprising:
    a plurality of memory macro regions,
    wherein the dummy pattern has a pattern identical to that of diffusion layer(s) and gate electrode(s) of a memory cell pattern arranged in a larger one of the memory macro regions.

7. The semiconductor integrated circuit device according to claim 1, wherein a predetermined one of the dummy diffusion layers and a predetermined one of the dummy gate electrodes in the dummy pattern operate as a Metal-Insulator-Semiconductor MIS capacitive element or a MISFET.

8. The semiconductor integrated circuit device according to claim 7, wherein a single well region includes a plurality of the dummy gate electrodes connected to each other by an additional wiring, the dummy gate electrodes and the additional wiring being formed in the same layer and process.

9. The semiconductor integrated circuit device according to claim 6, wherein a predetermined one of the dummy diffusion layers and a predetermined one of the dummy gate electrodes in the dummy pattern are connected to a wiring having a predetermined potential.

10. A semiconductor integrated circuit device comprising:
    a substrate;
    a basic circuit region comprising a basic circuit pattern on the substrate;
    a plurality of functional circuit regions comprising functional circuits on the substrate; and
    a dummy pattern region arranged between the plurality of functional circuit regions and between the basic circuit region and the plurality of functional circuit regions, said dummy pattern region including a dummy pattern;
    wherein the dummy pattern has a pattern identical to that of a diffusion layer(s) and a gate electrode(s) of the basic circuit pattern in the basic circuit region; and
    wherein an area ratio of dummy diffusion layer(s) and dummy gate electrode(s) in the dummy pattern region is equal to or greater than that of the diffusion layer(s) and the gate electrode(s) in the basic circuit region.

11. The semiconductor integrated circuit device according to claim 10, wherein the basic circuit is a flip flop circuit or a gate array basic cell.

12. The semiconductor integrated circuit device according to claim 8, wherein the pattern of the dummy gate electrodes, without the additional wiring, is identical to the pattern of the gate electrodes in the memory cell array region.

* * * * *